United States Patent [19]

Kawanami et al.

[11] 4,071,779
[45] Jan. 31, 1978

[54] SEMICONDUCTOR SWITCH

[75] Inventors: Mitsuru Kawanami; Ichiro Ohhinata, both of Yokohama; Shinzi Okuhara, Fujisawa, all of Japan

[73] Assignee: Hitachi, Ltd., Japan

[21] Appl. No.: 715,156

[22] Filed: Aug. 17, 1976

[30] Foreign Application Priority Data

Aug. 20, 1975  Japan .............................. 50-100190

[51] Int. Cl.² ...................... H03K 17/02; H03K 17/60
[52] U.S. Cl. .................................. 307/255; 307/237;
307/252 G; 307/299 B; 307/305
[58] Field of Search ........... 307/252 A, 252 J, 252 G,
307/252 N, 202, 299, 305, 299 A, 299 B, 252 D,
252 G, 255, 237; 357/38; 323/225 C

[56] References Cited

U.S. PATENT DOCUMENTS 3,822,387  7/1974  Mulder .............................. 307/299 B Primary Examiner—John Zazworsky
Attorney, Agent, or Firm—Craig & Antonelli

[57] ABSTRACT

A semiconductor switch of a PNPN structure comprises a PNPN switch of an equivalently four-layered structure including a P-type anode, N-type cathode, N-type gate and P-type gate, a first NPN transistor, a second PNP transistor, a level shifting circuit, and an impedance element, wherein the impedance element is connected between the collector and emitter of the first transistor, the first transistor has its collector and emitter connected to the P-type gate and N-type cathode respectively, and the second transistor has its emitter and base connected to the P-type anode and N-type gate, respectively, and has its collector connected to the base of the first transistor through the level shifting circuit. In this arrangement, the first transistor is driven by the current flowing through a PN junction at the end on the side of the anode of the PNPN switch and the level shifting circuit, so that the semiconductor switch has a great *dv/dt* withstanding power, operates with high sensitivity, has a high breakdown voltage in both directions and facilitates the setting of circuit constants.

21 Claims, 12 Drawing Figures

SEMICONDUCTOR SWITCH

The present invention relates to a semiconductor switch of an equivalently four-layered PNPN structure including three PN-junctions, the semiconductor switch being used as a switching element for control devices or the like.

The present invention will be apparent from the following detailed description taken in conjunction with the accompanying drawings, in which:

FIG. 1 is an equivalent circuit diagram showing a conventional semiconductor switch most similar to a semiconductor switch according to the present invention;

FIG. 2 is an equivalent circuit diagram showing a prior art semiconductor switch in accordance with U.S. Pat. No. 4,015,143;

Figure 1:
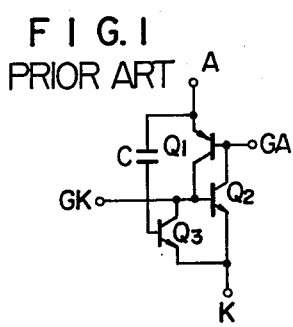

A semiconductor switch of an equivalently four-layered structure (hereinafter referred to as a PNPN switch) is, for example, a PNPN diode having only its anode and cathode electrodes provided, a three-terminal thyristor further provided with an additional cathode gate control terminal, or a four-terminal thyristor further provided with an additional anode-gate control terminal. The PNPN switches are adapted for use with various control devices or the like because they serve as a switching element having a self-holding function. These PNPN switches, however, have the drawback that they are turned on when an abrupt forward voltage is applied between their anode and cathode during cut off state. This is called a $dv/dt$-effect (or rate effect). Various proposals have been made to avoid the above drawback. A general method is to connect a resistor between the cathode gate GK and cathode K of the PNPN switch. In this method, however, the resistor must have low-resistance in order to achieve a great $dv/dt$ withstanding power. This undesirably leads to a poor gate sensitivity. In order to provide a PNPN switch having a great $dv/dt$ withstanding power and excellent gate sensitivity, a circuit as shown in FIG. 1 is disclosed in a U.S. Pat. No. 3,609,413 in which a PNPN switch including a PNP transistor $Q_1$ and an NPN transistor $Q_2$ has a transistor $Q_3$ connected between its cathode gate Gk and cathode k and has a capacitive element C so connected between its anode A and the base of the transistor $Q_3$ that the transistor $Q_3$ is operated to short-circuit a path between the cathode gate GK and cathode K only during the application of a transient voltage. In this method, however, the base-emitter path of the transistor $Q_3$ is free and forms a discharge circuit for the capacitive element C through a backward breakdown voltage therebetween, so that this method sometimes does not serves to protect the circuit against $dv/dt$ when the transient voltage is applied thereto in a repetitive manner. The employment of a capacitor as the capacitive element C is not suitable for a semiconductor integrated circuit. There is, on the other hand, a method in which a PN junction is used as the capacitive element C, but which has the drawback that the bidirectional high breakdown voltage property of the PNPN switch is destroyed because of the reduced backward breakdown voltage of the $dv/dt$-effect preventing circuit.

Figure 2:
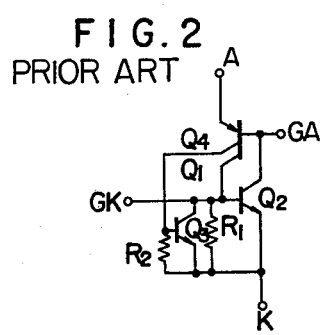

In order to overcome this drawback, the present inventors have made an invention with respect to a semiconductor switch as shown in FIG. 2 and disclosed in U.S. Pat. No. 4,015,143. In a circuit shown in FIG. 2, a PNP transistor $Q_4$ having a small current amplification factor is used instead of the capacitive element to drive the $dv/dt$-effect preventing transistor $Q_3$ in an attempt to improve the insufficient drive of the preventing transistor due to the influence from the charging and discharging circuit of the capacitive element without giving any influence to the bidirectional high breakdown voltage property of the PNPN switch. In this circuit arrangement, however, a problem arises when circuit constants are not suitably set. In other words the transistor $Q_3$ and $Q_4$ of the $dv/dt$-effect preventing circuit may operate simultaneously upon the operation of the transistor $Q_1$, $Q_2$ constituting the PNPN switch and, therefore, an oscillation takes place in that circuit arrangement when the current amplification factor $h_{FE}$ of the transistor $Q_4$ is not set so small enough to be one-hundredth to one-thousandth times as much as that of the transistor $Q_1$ in the PNPN switch. In this respect, the PNP transistor $Q_4$ must have a relatively large junction capacitance between its collector and base so as to drive the transistor $Q_3$ to a large extent when the transistor $Q_4$ receives the transient voltage, and must have a small current amplification factor so as to operate the transistor $Q_3$ as little as possible in a steady state. Alternatively, a suitable high-valued resistor $R_2$ is connected to interrupt the operation of the $dv/dt$-effect preventing circuit causing the oscillation in the steady state and to operate the $dv/dt$-effect preventing circuit sufficiently at the transient state. In any case, it is difficult to control the switching operation of the $dv/dt$-effect preventing circuit satisfactorily at the transient and steady states as is the case with the capacitive element with the result that suitable circuit constants can be set with difficulties.

An object of the present invention is to provide a semiconductor switch of a four-layered PNPN structure having a great $dv/dt$ withstanding power irrespective of a potential at its anode or cathode.

Another object of the present invention is to provide a semiconductor switch of a four-layered PNPN structure with a great $dv/dt$ withstanding power, which operates with high gate sensitivity and has a high breakdown voltage in both positive and negative directions.

A further object of the present invention is to provide a semiconductor switch of a four-layered PNPN structure in which the prevention of the $dv/dt$-effect can be achieved only during transient state and circuit constants thereof can be easily setable.

A semiconductor switch according to the present invention comprises a PNPN switch of an equvalently four-layered PNPN structure including a P-type anode, N-type cathode, N-type gate and P-type gate, a first transistor, a second transistor, and a level shifting circuit, wherein said first transistor has its collector and emitter connected to the P-type gate and N-type cathode of said PNPN switch, respectively, and said second transistor has its emitter and base connected to the P-type anode and N-type gate of said PNPN switch, respectively, and has its collector connected to the base of said first transistor through said level shifting circuit.

Figure 3:
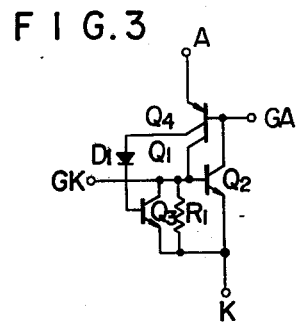
FIGS. 3 to 6 are equivalent circuit diagrams showing first to fourth embodiments of a semiconductor switch according to the present invention.

FIG. 3 is an equivalent circuit diagram showing a first embodiment of a semiconductor switch according to the present invention, in which $Q_1$ and $Q_2$ are, respectively, a PNP transistor and an NPN transistor with its P-emitter corresponding to an anode A; its N-base to an anode gate GA; its P-base to a cathode gate GK; and its N-emitter to a cathode K. $Q_3$ shows a dv/dt-effect preventing transistor for short-circuiting a PN junction between the cathode gate GK and cathode K; $Q_4$ a PNP transistor for driving the dv/dt-effect preventing transistor $Q_3$; $D_1$ a diode constituting a level shifting circuit according to the present invention; and $R_1$ a resistor for preventing a small dv/dt-effect. A multi-collector structure as shown in the figure can be easily obtained by manufacturing the PNP transistor $Q_1$ constituting the PNPN switch and the transistor $Q_4$ for driving the dv/dt-effect preventing transistor in the form of a lateral PNP transistor as is often used in the field of semiconductor integrated circuits. This structure makes it possible to prevent the reduction in breakdown voltage due to the connection of the dv/dt-effect preventing circuit. The use of this circuit causes the dv/dt-effect preventing transistor $Q_3$ to be turned off in view of the connection of the level shifting diode $D_1$ in a steady state where the PNPN switch is ON. Thus, harmful influences such as oscillation or increase in self-holding current due to the operation of the preventing transistor $Q_3$ can be avoided. The base level of the transistor $Q_3$ falls down from a level at the cathode K of the PNPN switch to a level lower by a backward breakdown voltage between the base and emitter of the transistor $Q_3$ than the level at the cathode K immediately after the PNPN switch has been turned on, but rises up immediately due to the operation of the transistor $Q_4$ and is kept at a level lower by a saturated voltage between the collector and emitter of the transistor $Q_4$ and an off-set voltage of the diode $D_1$ than the anode voltage. When, therefore, a dv/dt transient voltage is then applied, the preventing transistor $Q_3$ is effectively driven through the transistor $Q_4$ and the diode $D_1$ to elevate the dv/dt withstanding power.

Figure 7:
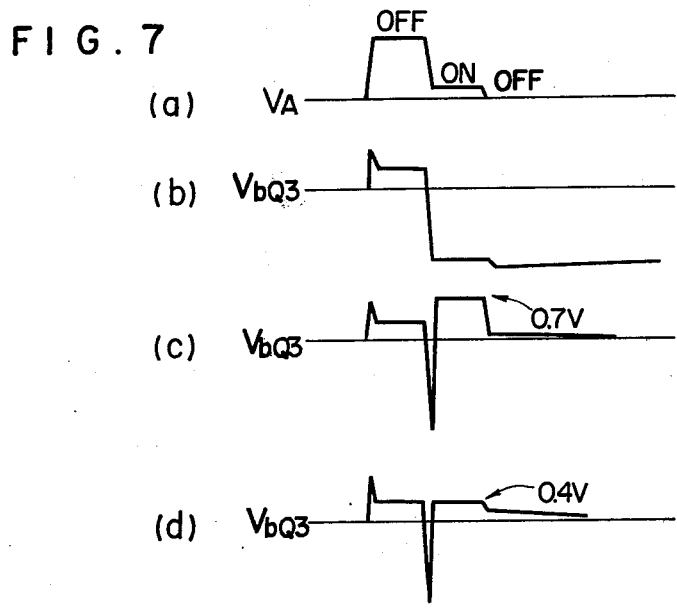
FIG. 7 shows waveforms for illustrating operations of a semiconductor device according to the present invention.

FIG. 7 shows waveforms of the base potential $VbQ_3$ of the dv/dt-effect preventing transistor $Q_3$ in the present invention in comparison with that in the prior art. The anode potential $V_A$ varies as shown in FIG. 7(a) with the base potential $VbQ_3$ of the transistor $Q_3$ varying as shown in FIG. 7(b) in the conventional circuit of FIG. 1, as shown in FIG. 7(c) in the conventional circuit of FIG. 2 and as shown in FIG. 7(d) in the circuit of FIG. 3 according to the present invention. It will be understood that the waveforms appearing when the PNPN switch is turned on are different from one another in each circuit. In the circuit of FIG. 1, the base potential $VbQ_3$ depressed negatively is hardly restored as shown in (b), and in the circuit of FIG. 2, the potential $VbQ_3$ can be restored but takes the value of 0.7 V as shown in (c). This means that the transistor $Q_3$ is also operated. In the circuit of FIG. 3 according to the present invention, on the other hand, the base potential $VbQ_3$ is restored immediately as shown in (d) and kept at a potential as small as 0.4 V at which the transistor $Q_3$ cannot be turned on.

The level shifting circuit is connected to the dv/dt-effect preventing circuit to produce a difference from an on-voltage of the PNPN switch. This leads to a non-preventive state where the dv/dt-effect preventing circuit cannot be operated, when the difference voltage is added as dv/dt. As a result, there is a danger of erroneous turning on of the PNPN switch, but the preventation against this small dv/dt can be carried out by the relatively high-valued resistor $R_1$. It should be noted that this resistor $R_1$ is also needed to avoid the fact that the PNPN switch is apt to be turned on only in response to leak current in a state where it has a completely opened path between its cathode gate GK and cathode K.

Figure 4:
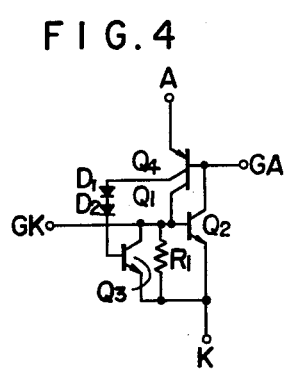

FIG. 4 is an equivalent circuit diagram showing a second embodiment of the semiconductor switch according to the present invention, in which the level shifting circuit includes two series-connected level shifting diodes $D_1$, $D_2$ to provide the complete interruption of operations of the dv/dt-effect preventing circuit even when the PNPN switch is employed for great current use or in a high ambient temperature.

Figure 5:
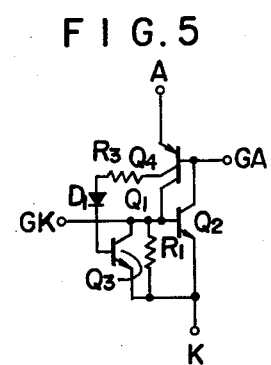

FIG. 5 is an equivalent circuit diagram showing a third embodiment of the semiconductor switch according to the present invention, in which the level shifting circuit comprises a series connection of the level shifting diode $D_1$ and a resistor $R_3$, its function being the same as that in FIG. 4.

Figure 6:
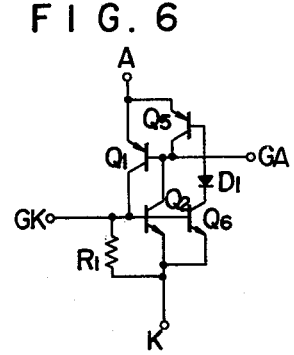

FIG. 6 is an equivalent circuit diagram showing a fourth embodiment of the semiconductor switch according to the present invention, in which a great dv/dt-effect preventing transistor $Q_5$ and the small dv/dt-effect preventing resistor $R_1$ are so connected as to short-circuit the PN junction at the separate ends of the PNPN switch. In other words, the PNPN switch has the dv/dt-effect preventing PNP transistor $Q_5$ connected between its anode A and anode gate GA, and its NPN transistor connected in parallel with the NPN transistor $Q_6$ for driving the dv/dt-effect preventing transistor $Q_5$ with the level shifting diode $D_1$ being connected between the transistors $Q_5$ and $Q_6$. It is to be noted that, in the PNPN switch whose breakdown voltage between its anode and anode gate acts as its backward breakdown voltage, the small dv/dt-effect preventing resistor $R_1$ is preferably connected between the cathode gate GK and cathode K because the PNPN switch has a reduced backward breakdown voltage if the resistor $R_1$ is connected between the anode gate GA and anode A.

The PNP transistor $Q_4$ shown in FIGS. 3 to 5 is illustrated in the form of a multi-collector structure, but separate PNP transistors may be used as shown in the circuit of FIG. 6. The PNPN switch comprises the PNP transistor $Q_1$ and the NPN transistor $Q_2$ as shown in FIGS. 3 to 6, but may be made of a semiconductor integrated circuit as is the case with a thyristor. That is, the PNPN switch is suitably a switch having an equivalently four-layered PNPN structure. Further, the small dv/dt-effect preventing resistor may be connected between the anode A and anode gate GA in a PNPN switch having a low breakdown voltage between the anode A and anode gate GA and a high breakdown voltage between the cathode K and cathode gate GK and having both junctions at the cathode gate GK which take charge of the forward and backward breakdown voltages of the PNPN switch. In other words, the resistor $R_1$ in FIG. 6 can be connected between the anode A and anode gate GA of the PNPN switch in parallel with the dv/dt-effect preventing PNP transistor $Q_5$, and the resistor $R_1$ in FIGS. 3 to 5 can be connected between the anode A and anode gate GA of the PNPN switch. The small dv/dt-effect preventing passive element is not only a resistor, but an additional parallel-connected capacitive element such as a capacitor, diode or the like.

Figure 8:
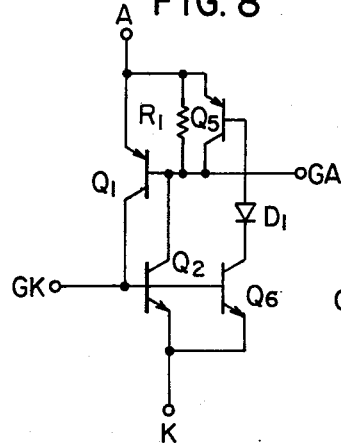
FIGS. 8–12 are equivalent circuit diagrams showing fifth to ninth embodiments of a semiconductor switch according to the present invention.

FIG. 8 is an equivalent circuit diagram showing a fifth embodiment of the semiconductor switch according to the present invention wherein a PNP transistor $Q_5$ has its emitter and collector connected to the P-type anode and N-type gate of the PNPN switch, respectively, and an NPN transistor $Q_6$ has its base and emitter connected to the P-type gate and N-type cathode of the PNPN switch, respectively. Further, there is provided a level shifting circuit in the form of diode $D_1$ and an impedance element in the form of a resistor $R_1$, the resistor $R_1$ being connected between the emitter and collector of the transistor $Q_5$. As is illustrated, the collector of the transistor $Q_6$ is connected to the base of the transistor $Q_5$ through the level shifting circuit $D_1$.

Figure 9:
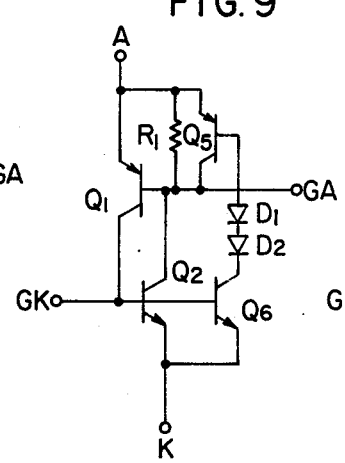

FIG. 9 is an equivalent circuit diagram showing a sixth embodiment of the semiconductor switch according to the present invention in which an additional level shifting diode $D_2$ is connected in series with the diode $D_1$ in the circuit of FIG. 8 between the base of the transistor $Q_5$ and the collector of the transistor $Q_6$.

Figure 10:
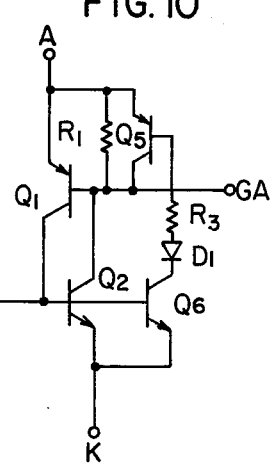
Figure 11:
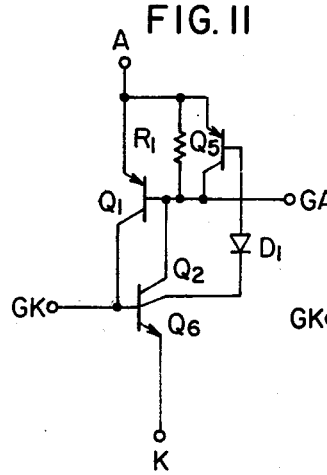

FIG. 10 is an equivalent circuit diagram showing a seventh embodiment of the semiconductor switch according to the present invention in which an impedance in the form of a resistor $R_3$ is connected in series with the level shifting diode $D_1$ in the circuit of FIG. 8. FIG. 11 is an equivalent circuit diagram showing an eighth embodiment of the semiconductor switch according to the present invention in which a multi-collector transistor replaces the transistors $Q_2$ and $Q_6$ in the circuit of FIG. 8.

Figure 12:
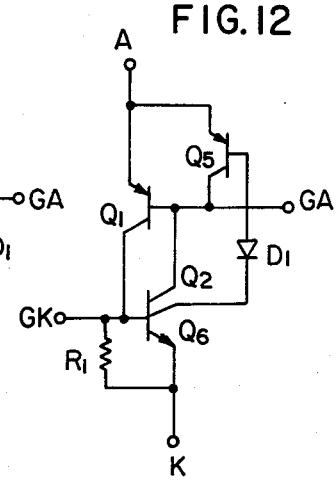

FIG. 12 is an equivalent circuit diagram showing a ninth embodiment of the semiconductor switch according to the present invention in which a multi-collector transistor replaces the transistors $Q_2$ and $Q_6$ in the circuit of FIG. 6.

As mentioned above, according to the present invention, the $dv/dt$-effect preventing transistor so connected as to short-circuit one of three PN junctions of the PNPN switch to prevent the latter from being erroneously turned on due to the $dv/dt$-effect is driven from the side of one primary electrode through the active element and level shifting circuit without being driven in the state where the PNPN switch is on with the result of no fear of having thereon any harmful influence such as the increase in self-holding current or oscillation. Further, the $dv/dt$-effective preventing transistor has a base potential, which is once depressed at the state of turning-on of the PNPN switch but restored immediately with the aid of the drive circuit capable of operating only with a potential difference, so that a discharging resistor is not needed to be connected between the base and emitter as in the prior art. This facilitates the setting of the circuit constants to a great extent. Moreover, the driving current of the $dv/dt$-effect preventing transistor is not bypassed through the resistor, but used as base current effectively, so that a great $dv/dt$-effect preventing ability can be expected. The $dv/dt$-effect preventing transistor and the circuit for driving the same are further constructed as synthetically having a high breakdown voltage in both directions with the result of no damage of the advantage that the PNPN switch has the bidirectional high withstand voltage. The impedance element for short-circuiting one PN junction and compensating a region in which the preventing transistor cannot be operated apparently serves to protect it against the small $dv/dt$-effect and can have a high impedance, so that the PNPN switch can be turned on in response to small gate current. Further, the circuit of the present invention can be realized in the form of a semiconductor integrated circuit with ease because it needs no capacitor.

What is claimed is:

1. A semiconductor switch comprising a PNPN switch of an equivalently four-layered PNPN structure including a P-type anode, N-type cathode, N-type gate and P-type gate, a first NPN transistor, a second PNP transistor, and a level shifting circuit, wherein said first transistor has its collector and emitter connected to the P-type gate and N-type cathode of said PNPN switch, respectively, and said second transistor has its emitter and base connected to the P-type anode and N-type gate of said PNPN switch, respectively, and has its collector connected to the base of said first transistor through said level shifting circuit.

2. A semiconductor switch according to claim 1, wherein said PNPN switch is formed from an NPN transistor and a PNP transistor, an N-type collector of said NPN transistor being connected to an N-type base of said PNP transistor and a P-type collector of said PNP transistor being connected to a P-type base of said NPN transistor.

3. A semiconductor switch according to claim 1, wherein one level shifting diode is used as said level shifting circuit.

4. A semiconductor switch according to claim 1, wherein a series-connected circuit of at least two level shifting diodes is used as said level shifting circuit.

5. A semiconductor switch according to claim 1, wherein a series-connected circuit of at least one level shifting diode and an impedance element is used as said level shifting circuit.

6. A semiconductor switch according to claim 1, wherein said PNPN switch of an equivalently four-layered structure comprises a PNP transistor and an NPN transistor, said PNP transistor being constructed as multi-collector structure to provide said second transistor.

7. A semiconductor switch comprising a PNPN switch of an equivalently four-layered PNPN structure including a P-type anode, N-type cathode, N-type gate and P-type gate, a first NPN transistor, a second PNP transistor, a level shifting circuit, and an impedance element, wherein said impedance element is connected between the collector and emitter of said first transistor, said first transistor has its collector and emitter connected to the P-type gate and N-type cathode of said PNPN switch, respectively, and said second transistor has its emitter and base connected to the P-type anode and N-type gate of said PNPN switch respectively, and has its collector connected to the base of said first transistor through said level shifting circuit.

8. A semiconductor switch according to claim 7, wherein said PNPN switch is formed from an NPN transistor and a PNP transistor, an N-type collector of said NPN-transistor being connected to an N-type base of said PNP transistor and a P-type collector of said PNP transistor being connected to a P-type base of said NPN transistor.

9. A semiconductor switch according to claim 7, wherein one level shifting diode is used as said level shifting circuit.

10. A semiconductor switch according to claim 7, wherein a series-connected circuit of at least two level shifting diodes is used as said level shifting circuit.

11. A semiconductor switch according to claim 7, wherein a series-connected circuit of at least one level shifting diode and an impedance element is used as said level shifting circuit.

12. A semiconductor switch according to claim 7, wherein said PNPN switch of an equivalently four-layered structure comprises a PNP transistor and an NPN transistor, said PNP transistor being constructed as multi-collector structure to provide said second transistor.

13. A semiconductor switch comprising a PNPN switch of an equivalently four-layered PNPN structure including a P-type anode, N-type cathode, N-type gate and P-type gate, a first PNP transistor, a second NPN transistor, a level shifting circuit, and an impedance element, wherein said impedance element is connected between the emitter and collector of said first transistor, said first transistor has its emitter and collector connected to the P-type anode and N-type gate of said PNPN switch, respectively, and said second transistor has its base and emitter connected to the P-type gate and N-type cathode of said PNPN switch, respectively, and has its collector connected to the base of said first transistor through said level shifting circuit.

14. A semiconductor switch according to claim 13, wherein said PNPN switch is formed from an NPN transistor and a PNP transistor, an N-type collector of said NPN transistor being connected to an N-type base of said PNP transistor and a P-type collector of said PNP transistor being connected to a P-type base of said NPN transistor.

15. A semiconductor switch according to claim 13, wherein one level shifting diode is used as said level shifting circuit.

16. A semiconductor switch according to claim 13, wherein a series-connected circuit of at least two level shifting diodes is used as said level shifting circuit.

17. A semiconductor switch according to claim 3, wherein a series-connected circuit of at least one level shifting diode and an impedance element is used as said level shifting circuit.

18. A semiconductor switch according to claim 13, wherein said PNPN switch of an equivalently four-layered structure comprises a PNP transistor and an NPN transistor, said NPN transistor being constructed as multi-collector structure to provide said second transistor.

19. A semiconductor switch comprising a PNPN switch of an equivalently four-layered PNPN structure including a P-type anode, N-type cathode, N-type gate and P-type gate, a first PNP transistor, a second NPN transistor, a level shifting circuit, and an impedance element, wherein said first transistor has its emitter and collector connected to the P-type anode and N-type gate of said PNPN switch, respectively, and said second transistor has its base and emitter connected to the P-type gate and N-type cathode of said PNPN switch, respectively, and has its collector connected to the base of said first transistor through said level shifting circuit, said impedance element being connected between the P-type gate and the N-type cathode of said PNPN switch.

20. A semiconductor switch according to claim 19, wherein said PNPN switch is formed from an NPN transistor and a PNP transistor, an N-type collector of said NPN transistor being connected to an N-type base of said PNP transistor and a P-type collector of said PNP transistor being connected to a P-type base of said NPN transistor.

21. A semiconductor switch according to claim 19, wherein said PNPN switch of an equivalently four-layered structure comprises a PNP transistor and an NPN transistor, said NPN transistor being constructed as multi-collector structure to provide said second transistor.

* * * * *